(12) United States Patent
Ahn et al.

(10) Patent No.: US 8,792,609 B2
(45) Date of Patent: Jul. 29, 2014

(54) SHIFT REGISTER

(71) Applicant: LG Display Co., Ltd., Seoul (KR)

(72) Inventors: Jung-Eun Ahn, Chilgok-gun (KR); Bo-Young Jung, Gumi-si (KR); Ji-Eun Chae, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/942,088

(22) Filed: Jul. 15, 2013

(65) Prior Publication Data

US 2013/0301792 A1    Nov. 14, 2013

Related U.S. Application Data

(62) Division of application No. 13/302,828, filed on Nov. 22, 2011, now Pat. No. 8,509,378.

(30) Foreign Application Priority Data

Jul. 12, 2011  (KR) .......................... 10-2011-0068915

(51) Int. Cl.
*G11C 19/00* (2006.01)
(52) U.S. Cl.
USPC .................................. 377/64; 377/78; 377/79

(58) Field of Classification Search
None
See application file for complete search history.

(56) References Cited

U.S. PATENT DOCUMENTS

| 8,040,313 | B2 | 10/2011 | Jang |
| 8,059,780 | B2 | 11/2011 | Wang et al. |
| 2007/0195920 | A1 | 8/2007 | Tobita |
| 2007/0274433 | A1* | 11/2007 | Tobita ............................ 377/64 |
| 2008/0226013 | A1 | 9/2008 | Deane |

* cited by examiner

*Primary Examiner* — Tuan T Lam
(74) *Attorney, Agent, or Firm* — Birch, Stewart, Kolasch & Birch, LLP

(57) ABSTRACT

A shift register is discussed in which a pull-up switching device is turned off positively in a period in which no scan pulse is forwarded for securing drive stability and prevents a picture quality from becoming poor. The shift register in one embodiment includes stages having any one of first and second start pulses, and any one of first to fourth clock pulses to forward a scan pulse in succession, wherein the first and second start pulses are in gate high voltage states for two horizontal periods, with the second start pulse forwarded with a delay of one horizontal period than the first start pulse. The first to fourth clock pulses are in gate high voltages for two horizontal periods, with one horizontal period delay to one another.

4 Claims, 9 Drawing Sheets

SHIFT REGISTER

CROSS REFERENCE TO RELATED APPLICATION

This application is a Divisional of Application No. 13/302,828 filed on Nov. 22, 2011, now U.S. Pat. No. 8,509,378 issued on Aug. 13, 2013, and which claims the benefit of the Korean Patent Application No. 10-2011-0068915, filed on Jul. 12, 2011, which are hereby incorporated by reference as if fully set forth herein.

BACKGROUND OF THE DISCLOSURE

1. Field of the Disclosure

The present invention relates to a shift register in which a pull-up switching device is turned off positively in a period in which no scan pulse is forwarded for securing drive stability and prevents a picture quality from becoming poor.

2. Discussion of the Related Art

Recently, a GIP (Gate In Panel) type display device is introduced, in which a gate driving circuit is built in a panel thereof for reducing volume and weight of the display device and saving production cost.

In the GIP type display device, the gate driving circuit is built in a non-display region of the panel by using an amorphous silicon thin film transistor (Hereafter call as TFT). The gate driving circuit has the shift register for supplying a scan pulse to a plurality of gate lines in succession. The shift register has a plurality of stages for forwarding the scan pulse by using a clock pulse from a timing controller, each with a pull up TFT for forwarding the clock pulse as the scan pulse depending on a signal state of a set node.

The pull up TFT is turned on only in a portion of one frame period, and turned off in most of the period except the portion of the period. According to this, each of the stages forwards the scan pulse only in the portion of the one frame period, and a low voltage in rest of the period.

In the meantime, if the pull up TFT is turned on in the period in which no scan pulse is forwarded, an output voltage of a stage which is required to sustain the low voltage becomes unstable, which is likely to cause a poor picture quality. Therefore, each of the stages has a plurality of control TFTS for discharging potential of the set node to the low state in the period in which no scan pulse is forwarded.

The plurality of control TFTS includes a first control TFT for discharging the set node in response to a start pulse, a second control TFT for discharging the set node in response to the scan pulse provided from a next state, and a third control TFT for discharging the set node in response to the clock pulse.

In the meantime, there is a blank period between frames, in which no clock pulse is forwarded. The shift register has a problem in that many control TFTS do not operate in the blank period, causing the set node to float. Particularly, all of the first to third control TFTS do not operate in a period within the blank period after the start pulse is forwarded, to float the set node. Once the set node is floated, a leakage current is liable to generate in the pull up TFT due to coupling, and the output voltage of the stage becomes unstable, resulting in a poor picture quality.

SUMMARY OF THE DISCLOSURE

Accordingly, the present invention is directed to a shift register.

An object of the present invention is to provide a shift register in which a pull-up switching device is turned off positively in a period in which no scan pulse is forwarded for securing drive stability and prevents a picture quality from becoming poor.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a shift register includes a plurality of stages having any one of first and second start pulses, and any one of first to fourth clock pulses provided thereto to forward a scan pulse in succession, wherein the first and second start pulses are in gate high voltage states for two horizontal periods, with the second start pulse forwarded with a delay of one horizontal period than the first start pulse, the first to fourth clock pulses are in the gate high voltage states for two horizontal periods, with one horizontal period delay to one another, $(4n+1)$th stages (Where, n is a natural numeral) are initialized in response to the second start pulse, and $(4n+2)$th stages, $(4n+3)$th stages, and $(4n)$th stages are initialized in response to the first start pulse.

Each of the $(4n+1)$th stages includes a pull up switching device supplying a first clock pulse to an output terminal according to a signal state of a set node, a pull down switching device supplying a low voltage power to the output terminal in response to the third clock pulse, a first switching device supplying a scan pulse from a $(4n-1)$th stage to the set node in response to the scan pulse from the $(4n-1)$th stage, a second switching device supplying the low voltage power to the set node in response to the second start pulse, a third switching device supplying the low voltage power to the set node in response to a scan pulse from a $(4n+3)$th stage, and a fourth switching device supplying a scan pulse from a $(4n)$th stage to the set node in response to the fourth clock pulse.

Each of the $(4n+2)$th stages, the $(4n+3)$th stages, and the $(4n)$th stages includes a pull up switching device supplying any one of the second to fourth clock pulses to an output terminal according to a signal state of a set node, a pull down switching device supplying a low voltage power to the output terminal in response to a clock pulse delayed by two horizontal periods than the clock pulse provided to the pull up switching device, a first switching device supplying a scan pulse from a two-previous stage to the set node in response to the scan pulse provided from the two-previous stage, a second switching device supplying the low voltage power to the set node in response to the first start pulse, a third switching device supplying the low voltage power to the set node in response to the scan pulse from a two-next stage, and a fourth switching device supplying a scan pulse from a previous stage to the set node in response to a clock pulse delayed by three horizontal periods than the clock pulse provided to the pull up switching device.

Each of the plurality of clock pulses has a blank period in which no clock pulse is forwarded between frames, the clock pulses are forwarded again starting from a falling edge of the first start pulse after the blank period is passed, and the first to fourth clock pulses are forwarded in succession delayed to one another.

In another aspect of the present invention, a shift register includes a plurality of stages having any one of first and second start pulses, and any one of first to fourth clock pulses provided thereto to forward a scan pulse in succession, wherein the first and second start pulses are in gate high voltage states for two horizontal periods, with the second start pulse forwarded with a delay of one horizontal period than the first start pulse, the first to fourth clock pulses are in the gate high voltage states for two horizontal periods, with one horizontal period delay to one another, and rest of the stages except the first and second stages are initialized in response to the second start pulse.

Each of the plurality of stages except the first and second stages includes; a pull up switching device supplying any one of first to fourth clock pulses to an output terminal according to a signal state of a set node, a pull down switching device supplying a low voltage power to the output terminal in response to a clock pulse delayed by two horizontal periods than the clock pulse provided to the pull up switching device, a first switching device supplying a scan pulse from a two-previous stage to the set node in response to the scan pulse from the two-previous stage, a second switching device supplying the low voltage power to the set node in response to the second start pulse, a third switching device supplying the low voltage power to the set node in response to a scan pulse from a two-next stage, and a fourth switching device supplying a scan pulse from a previous stage to the set node in response to a clock pulse delayed by three horizontal periods than the clock pulse provided to the pull up switching device.

Each of the plurality of stages except the first and second stages includes; a pull up switching device supplying any one of the first to fourth clock pulses to an output terminal according to a signal state of a set node, a pull down switching device supplying a low voltage power to the output terminal in response to a clock pulse delayed by two horizontal periods than the clock pulse provided to the pull up switching device, a first switching device supplying a scan pulse from a two-previous stage to the set node in response to the scan pulse from the two-previous stage, a third switching device supplying the low voltage power to the set node in response to a scan pulse from a two-next stage, and a fourth switching device supplying a scan pulse from a previous stage to the set node in response to the second start pulse or a clock pulse delayed by three horizontal periods than the clock pulse provided to the pull up switching device.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DESCRIPTION OF SPECIFIC EMBODIMENTS

Reference will now be made in detail to the specific embodiments of the present invention, examples of which are illustrated in the accompanying drawings.

Wherever possible, the same reference numbers will be used throughout the drawings to refer to the same or like parts.

Before starting description of the present invention, an example of shift register comparative to the shift register of the present invention will be described with reference to a drawing attached hereto.

Figure 1:
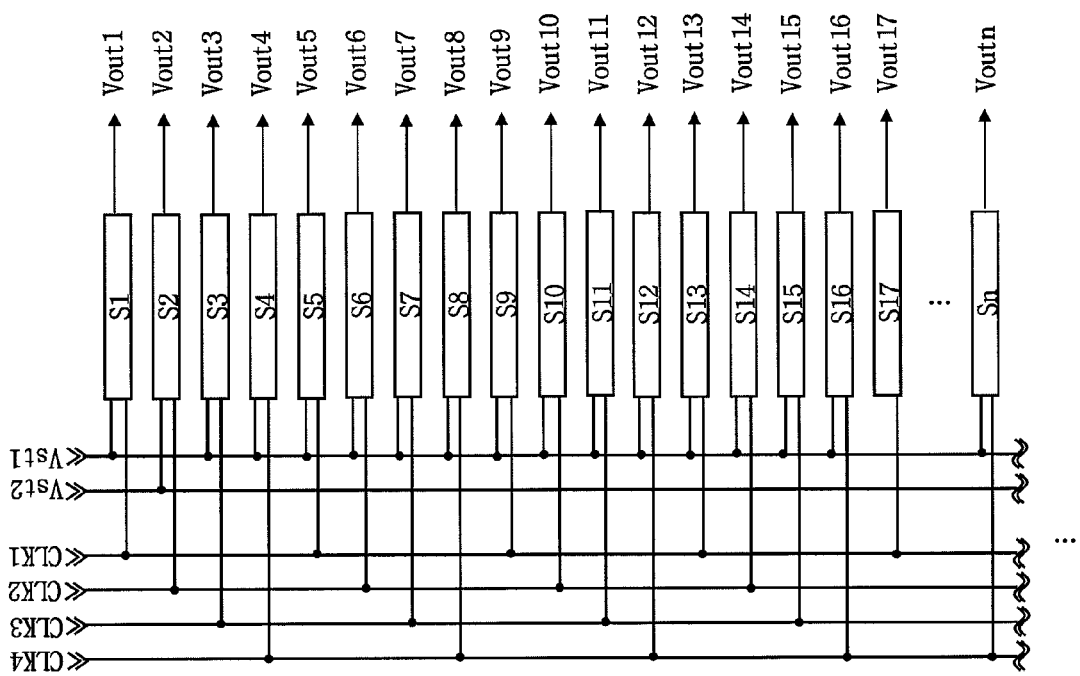
FIG. 1 illustrates a block diagram of a comparative example of shift register.

FIG. 1 illustrates a block diagram of a comparative example of shift register.

Referring to FIG. 1, the shift register includes a plurality of stages S1~Sn. The plurality of stages S1~Sn forward a plurality of scan pulses Vout1~Voutn in succession in response to a plurality of clock pulses CLK1~CLK4, and a plurality of start pulses Vst1 and Vst2 provided from a timing controller.

In detail, the plurality of stages S1~Sn include a first to an (n)th stages S1~Sn, to forward the scan pulses Vout1~Voutn in succession starting from a first stage S1 to an (n)th stage Sn.

By describing operation of a (k)th stage, operation of each of the stages S1~Sn will be described.

The (k)th stage Sk is initialized by a first start pulse Vst1 which is applied thereto at an initial stage of every frame. After the initialization, the (k)th stage Sk receives the scan pulse Voutk−2 from a (k−2)th stage Sk−2, and forwards the scan pulse Vout of a gate high voltage (Hereafter, a high state) in response to the scan pulse Voutk−2 from a (k−2)th stage Sk−2. And, the (k)th stage Sk receives the scan pulse Voutk+2 from a (k+2)th stage Sk+2, and forwards the scan pulse Vout of a gate low voltage (Hereafter, a low state) in response to the scan pulse Voutk+2 from a (k+2)th stage Sk+2.

However, the first and second stages S1 and S2 receive first and second start pluses Vst1 and Vst2, and forward a high state scan pulse Vout in response to the first and second start pluses Vst1 and Vst2, respectively. That is, the first and second stages S1 and S2 do not have the initialization period.

And, (n−1)th and (n)th stages Sn−1 and Sn forward a low state scan pulse Vout in response to signals from first and second dummy stages which are not shown, respectively.

Figure 2:
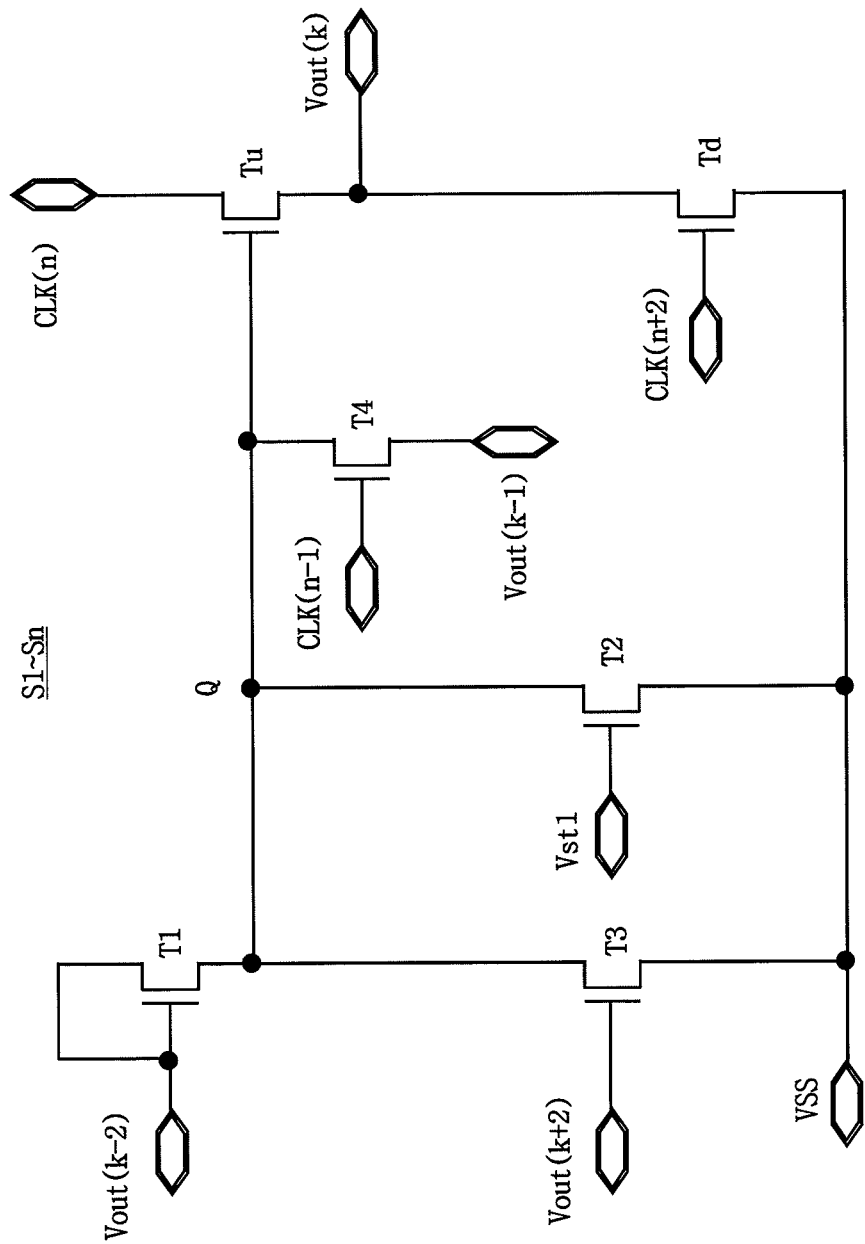
FIG. 2 illustrates a circuit diagram of a (k)th stage in FIG. 1.
Figure 3:
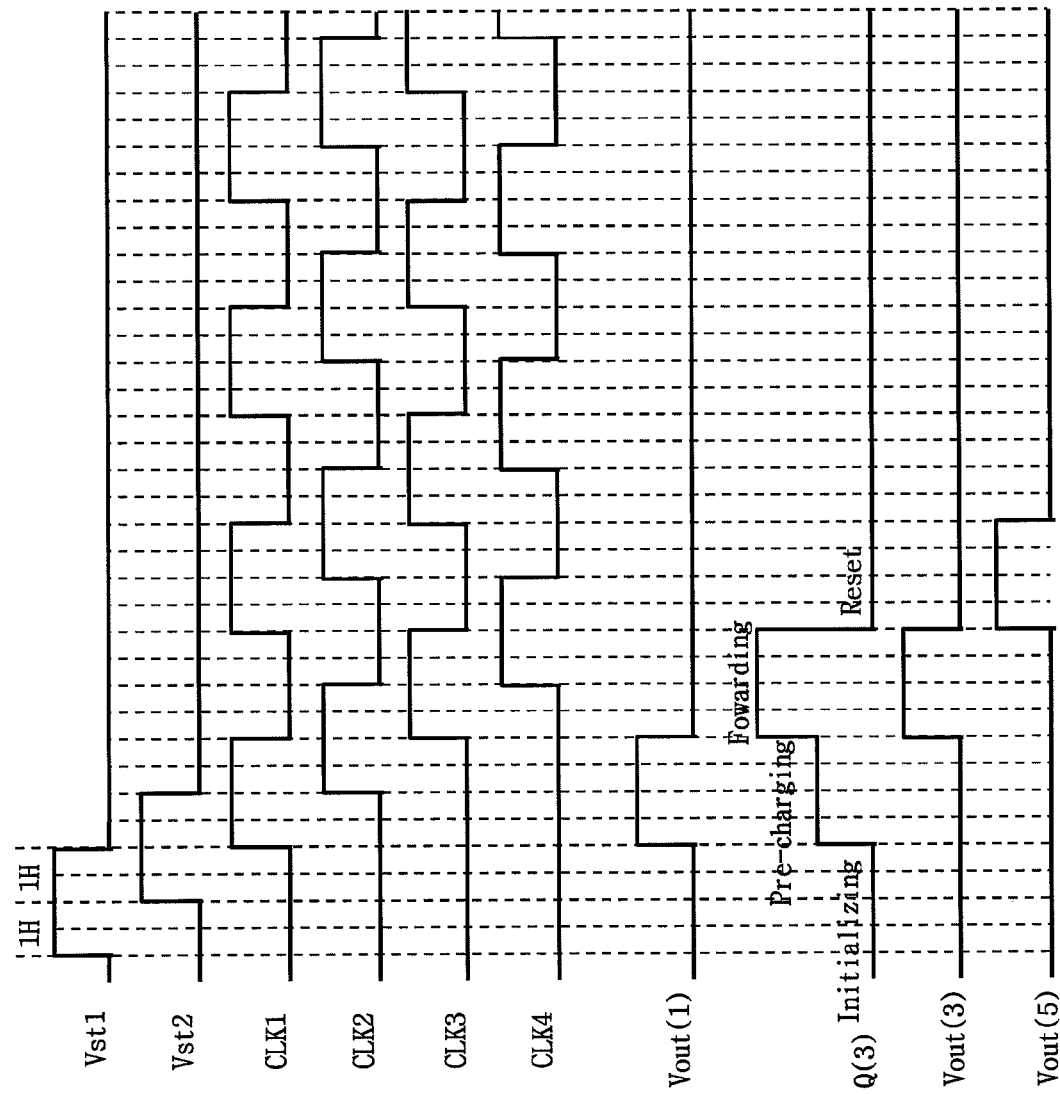
FIGS. 3 and 4 illustrate driving waveforms of the circuit diagram in FIG. 2, respectively.

FIG. 2 illustrates a circuit diagram of the (k)th stage in FIG. 1, and FIG. 3 illustrates driving waveforms of the circuit diagram in FIG. 2.

Referring to FIG. 2, the (k)th stage includes a pull up TFT Tu, a pull down TFT Td, and first to fourth TFTS T1~T4.

The pull up TFT Tu is turned on/off according to a signal state of a set node Q, for forwarding the scan pulse Vout through an output terminal when the pull up TFT Tu is turned on. In this instance, the pull up TFT Tu receives one of the first to fourth clock pulses CLK1~CLK4 to forward the same as the scan pulse Vout.

The pull down TFT Td is turned on/off according to the clock pulse delayed by two horizontal periods than the clock pulse to the pull up TFT Tu, for connecting a low voltage power supply line to the output terminal when the pull down TFT Td is turned on. In this instance, the clock pulse to the pull up TFT Tu has a phase inverted by 180° with respect to a phase of the clock pulse which controls the pull down TFT Td.

The first TFT T1 is turned on/off according to the scan pulse Voutk−2 from the (k−2)th stage SK−2 for applying the scan pulse Voutk−2 from the (k−2)th stage Sk−2 to the set node Q when the first TFT T1 is turned on. However, the first TFTS T1 provided to the first and second stages S1 and S2 apply the first and second start pulses Vst1 and Vst2 to the set node Q in response to the first and second start pulses Vst1 and Vst2.

The second TFT T2 is turned on/off according to the first start pulse Vst1 for connecting the low voltage power supply line VSS to the set node Q when the second TFT T2 is turned on. However, the second TFTS T2 provided to the first and second stages S1 and S2 do not operate.

The third TFT T3 is turned on/off according to the scan pulse Voutk+2 from a (k+2)th stage Sk+2 for connecting the low voltage power supply line VSS to the set node Q when the third TFT T3 is turned on.

The fourth TFT T4 is turned on/off according to the clock pulse delayed by three horizontal periods than the clock pulse supplied to the pull up TFT Tu. The fourth TFT T4 connects the output terminal of the (k−1)th stage Sk−1 to the set node Q.

The operation of the stage having the foregoing configuration will be described. Since the operations of the stages are identical, the operation of the stages will be described taking the third stage S3 as an example.

Referring to FIG. 3, the third stage S3 is driven divided into an initializing period, forwarding period, a pre-charging period, and a reset period, which are repetitive in every frame.

At first, in the initializing period, the start pulse Vst1 of a high state is supplied to a gate terminal of the second TFT T2. Then, the second TFT T2 is turned on to supply low voltage power VSS to the set node Q3. According to this, the set node Q is initialized into the low state.

Then, in the pre-charging period, the first scan pulse Vout1 of the high state provided from the first stage S1 is supplied to a gate terminal of the first TFT T1. Then, the first TFT T1 is turned on to supply the first scan pulse Vout1 to the set node Q3. According to this, the set node Q is pre-charged.

Then, in the forwarding period, the third clock pulse CLK3 of the high state is supplied to a drain terminal of the pull up TFT Tu. Then, owing to coupling of parasitic capacitors between the gate terminal and the drain terminal of the pull up TFT Tu, a voltage of the set node Q3 pre-charged thus is bootstrapped. According to this, the pull up TFT Tu becomes a turned on state perfectly, to supply the third clock pulse CLK3 of the high state to the output terminal as the third scan pulse Vout3 through the pull up TFT Tu turned on thus.

Then, in the reset period, the fifth scan pulse Vout5 of the high state provided from the fifth stage S5 is supplied to the gate terminal of the third TFT T3. Then, the third TFT T3 is turned on to supply the low voltage power VSS to the set node Q3. According to this, the set node Q3 is reset into the low state.

Thus, each of the stages S1~Sn forwards the scan pulse Vout while repeating the initialization period, the pre-charging period, the forwarding period, and the reset period.

In the meantime, there is the blank period in which no clock pulse CLK1~CLK4 is forwarded between the frames. In the meantime, the comparative example shift register has problems in that the set node Q is floated at some of the plurality of stages S1~Sn, and a leakage current occurs at the pull up TFT in the blank period. In detail, the stages each of which has the leakage current to occur at the pull up TFT due to the floating of the set node Q are (4n+1)th stages S4n+1 (Where, n is a natural numeral), such as 5th, 9th, 13th, and 17th stages S5, S9, S13, and S17 under the following reason.

Figure 4:
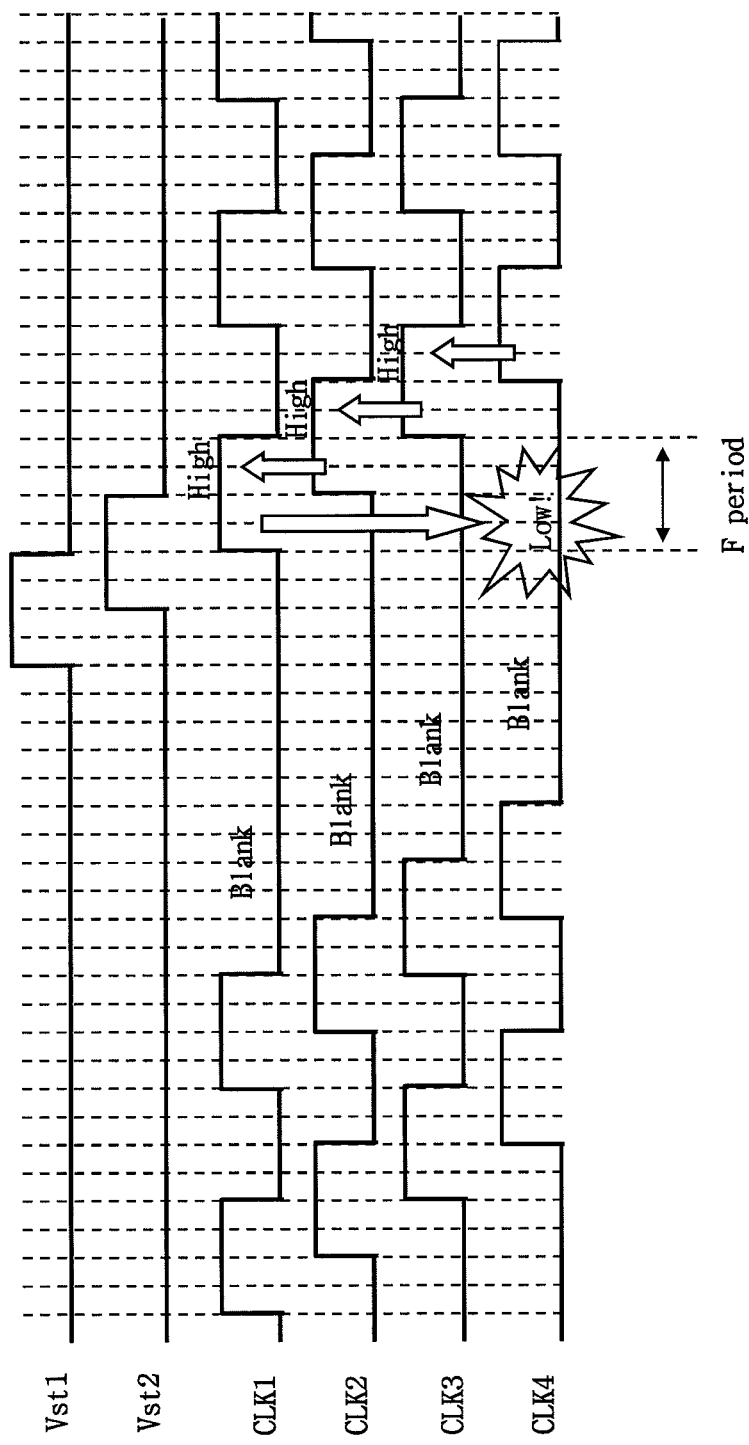

Referring to FIG. 4, each of the plurality of clock pulses CLK1~CLK4 has the blank period in which no clock pulse CLK1~CLK4 is forwarded between the frames. Each of the plurality of clock pulses CLK1~CLK4 is forwarded again after the blank period, delayed in succession starting from the first clock pulse CLK1 to the fourth clock pulse CLK4. In this instance, the plurality of clock pulses CLK1~CLK4 are forwarded again with reference to a falling edge of the first start pulse Vst1.

That is, the plurality of the clock pulses CLK1~CLK4 are forwarded again starting from the falling edge of the first start pulse Vst1 in an order of the first clock pulse CLK1, the second clock pulse CLK2, the third clock pulse 3, and the fourth clock pulse CLK4. Therefore, at the time the first clock pulse CLK1 is forwarded again for the first time right after the first start pulse Vst1 is forwarded, the fourth clock pulse CLK4 is not forwarded, yet. Hereafter, "a period the first clock pulse CLK1 is forwarded again for the first time right after the first start pulse Vst1 is forwarded" is defined as an "F period". That is, the F period is a period in which the first clock pulse CLK1 is forwarded again for the first time as well as the fourth clock CLK4 is not forwarded, yet.

Figure 5:
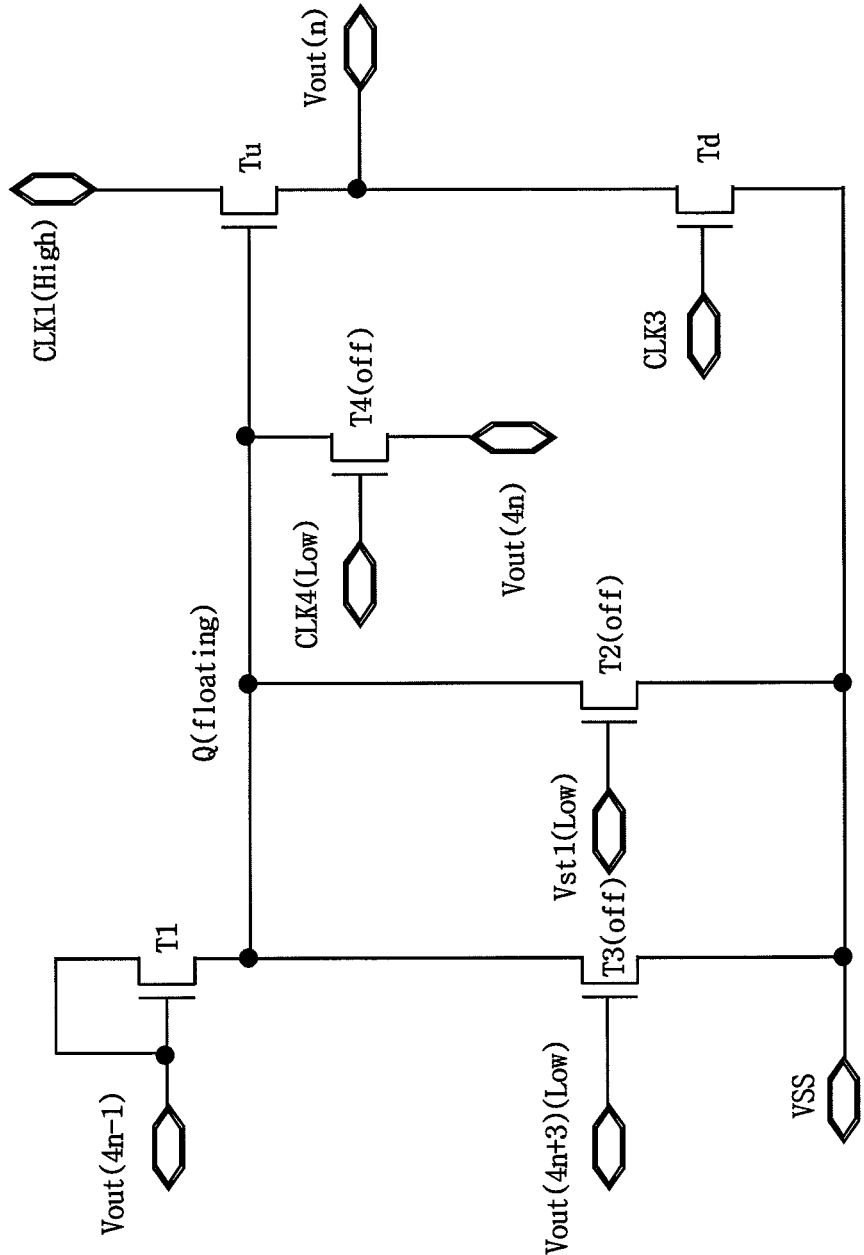
FIG. 5 illustrates a circuit diagram of the (4n+1)th stage in FIG. 1.

In the meantime, referring to FIG. 5, in the (4n+1)th stage S4n+1, the pull up TFT Tu has the drain terminal with the first clock pulse CLK1 applied thereto, and the fourth TFT T4 has the gate terminal with the fourth clock pulse CLK4 applied thereto. Therefore, the fourth TFT T4 in the (4n+1)th stage S4n+1 is turned off in the F period since the fourth clock pulse CLK4 is not forwarded, yet. And, the second and third TFTS T2 and T3 in the (4n+1)th stage S4n+1 are turned off in the F period since the scan pulse Vout and the first start pulse Vst1 are in the low state at the stage two stages after. At the end, since all the second to fourth TFTS T2~T4 in the (4n+1)th stage S4n+1 are turned off in the F period, the set node Q in the (4n+1)th stage S4n+1 floats.

Thus, the set node Q in the (4n+1)th stage S4n+1 is floated in the F period. However, since the pull up TFT Tu has the drain terminal with the first clock pulse CLK1 of the high state being applied thereto, the leakage current is liable to occur. Such a leakage current causes the output voltages of the (4n+1)th stage S4n+1 to fluctuate, causing a transverse line display defect.

The problem of the pull up TFT leakage current is caused by the fourth clock pulse CLK4 being not forwarded yet in the period the first clock pulse CLK1 is forwarded again for the first time right after the forwarding of the first start pulse Vst1. The reason the problem of the pull up TFT leakage current does not occur in the stages except the (4n+1)th stage S4n+1 is as follows.

Referring to FIG. 4, in the period the second clock pulse CLK2 is forwarded right after the forwarding of the first start pulse Vst1 for the first time, the first clock pulse CLK1 is in the high state, in the period the third clock pulse CLK3 is forwarded right after the forwarding of the first start pulse Vst1 for the first time, the second clock pulse CLK2 is in the high state, and in the period the fourth clock pulse CLK4 is forwarded right after the forwarding of the first start pulse Vst1 for the first time, the third clock pulse CLK3 is in the high state. Therefore, each of the (4n+2)th stage S4n+2, the (4n+3)th stage S4n+3, and the (4n)th stage S4n in each of which the second to fourth clock pulses CLK2~CLK4 are applied to the drain terminal of the pull up TFT Tu has the fourth TFT T4 turned on right after forwarding of the first start pulse Vst1, initializing the set node Q into the low state. According to this, the pull up TFT Tu in each of the (4n+2)th stage S4n+2, the (4n+3)th stage S4n+3, and the (4n)th stage S4n causes no problem of the leakage current right after the forwarding of the first start pulse Vst1.

In summary, the comparative example shift register has the problem of unstable fluctuation of the outputs of the (4n+1)th stages S4n+1 due to the fourth clock pulse CLK4 being not forwarded yet in the period (F period) the first clock pulse CLK1 is forwarded for the first time again right after the forwarding of the first start pulse Vst1.

In order to solve the problem of the comparative example shift register, the present invention utilizes the second start pulse Vst2. The shift register in accordance with a preferred embodiment of the present invention will be described in more detail, with reference to the attached drawings.

Figure 6:
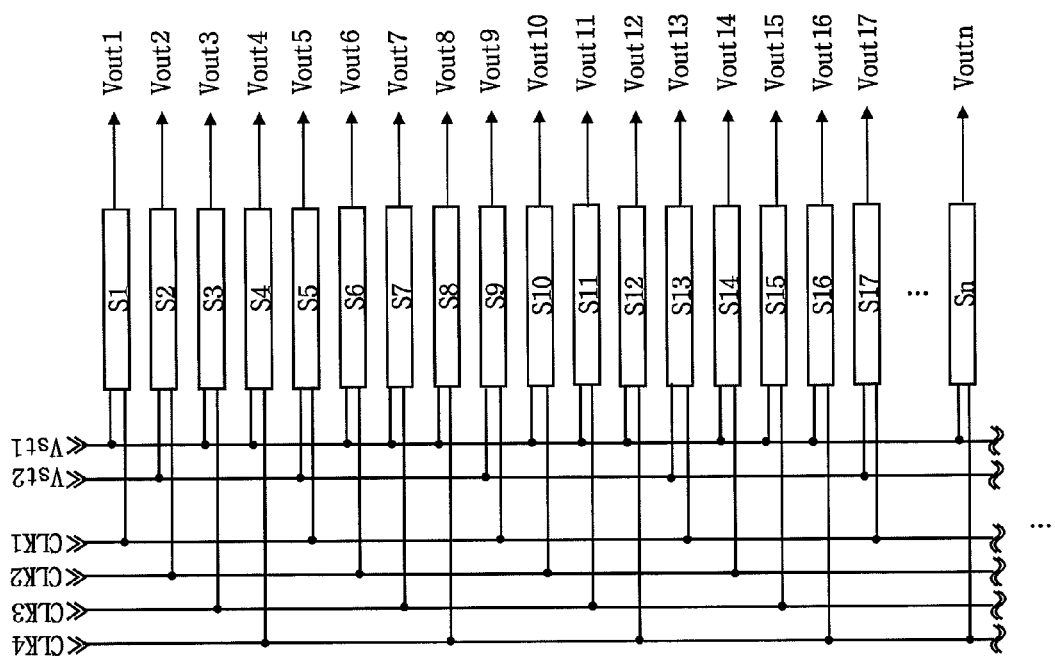
FIG. 6 illustrates a block diagram of a shift register in accordance with a first preferred embodiment of the present invention.

FIG. 6 illustrates a block diagram of a shift register in accordance with a first preferred embodiment of the present invention.

Referring to FIG. 6, the shift register includes a plurality of stages S1~Sn.

The plurality of stages S1~Sn forward a plurality of scan pulses Vout1~Voutn in succession in response to a plurality of clock pulses CLK1~CLK4, and a plurality of start pulses Vst1 and Vst2 provided from a timing controller.

The plurality of clock pulses CLK1~CLK4 include first to fourth clock pulses CLK1~CLK4, and the plurality of the start pulses Vst1 and Vst2 include first and second start pulses Vst1 and Vst2.

The first to fourth clock pulses CLK1~CLK4 cycles repetitively with phases different from one another. Each of the clock pulses CLK1~CLK4 is in a high state for two horizontal periods. And, the first to fourth clock pulses CLK1~CLK4 are forwarded with one horizontal period delay to one another (adjacent two clock pulses are overlapped for one horizontal period). In the meantime, though the clock pulses CLK1~CLK4 in the first embodiment include four kinds of clock pulses having phases different from one another, a number of the clocks are not limited as far as the number is more than two.

The first and second start pulses Vst1 and Vst2 are forwarded with phases different from each other, with only one time of a high state at starting of every frame. The first and second start pulses Vst1 and Vst2 are at the high state for two horizontal periods, and the second start pulse Vst2 is forwarded with a delay of one horizontal period than the first start pulse Vst1. In the meantime, in the first embodiment, though the start pulses Vst1 and Vst2 includes two kinds of start pulses having phases different from each other, a number of the start pulses are not limited as far as the number is more than two.

A high voltage power source VDD and a low voltage power source VSS are DC voltages, wherein the high voltage power source VDD has a voltage higher than the low voltage power source VSS. For an example, the high voltage power source VDD may have a positive polarity, and the low voltage power source VSS may have a negative polarity. In the meantime, the low voltage power source VSS may be a ground voltage. And, the low voltage power source VSS has a voltage the same with the low state of the clock pulse CLK.

The plurality of stages S1~Sn include a first to an (n)th stage S1~Sn, to forward the scan pulses Vout1~Voutn in succession starting from the first stage S1 to the (n)th stage Sn.

By describing operation of a (k)th stage, operation of each of the stages S1~Sn will be described.

The (k)th stage Sk is initialized by one of the first and second start pulses Vst1 and Vst2 applied thereto. In detail, the (4n+1)th stages S4n+1 are initialized by the second start pulse Vst2 applied thereto. And, rest of the stages except the (4n+1)th stages S4n+1, i.e., the (4n+2)th stages S4n+2, the (4n+3)th stages S4n+3, and the (4n)th stages S4n are initialized by the first start pulse Vst1 applied thereto.

After the initialization, the (k)th stage Sk receives the scan pulse Voutk−2 from the (k−2)th stage Sk−2, and forwards the scan pulse Vout of the high state in response to the scan pulse Voutk−2 from the (k−2)th stage Sk−2. And, the (k)th stage Sk receives the scan pulse Voutk+2 from the (k+2)th stage Sk+2, and forwards the scan pulse Vout of the low state in response to the scan pulse Voutk+2 from the (k+2)th stage Sk+2.

However, the first and second stages S1 and S2 receive first and second start pluses Vst1 and Vst2, and forward a high state scan pulse Vout in response to the first and second start pluses Vst1 and Vst2, respectively. And, the (n−1)th and (n)th stages Sn−1 and Sn receive signals from first and second dummy stages, and forward a low state scan pulse Vout in response to a signal from first and second dummy stages which are not shown, respectively.

Figure 7:
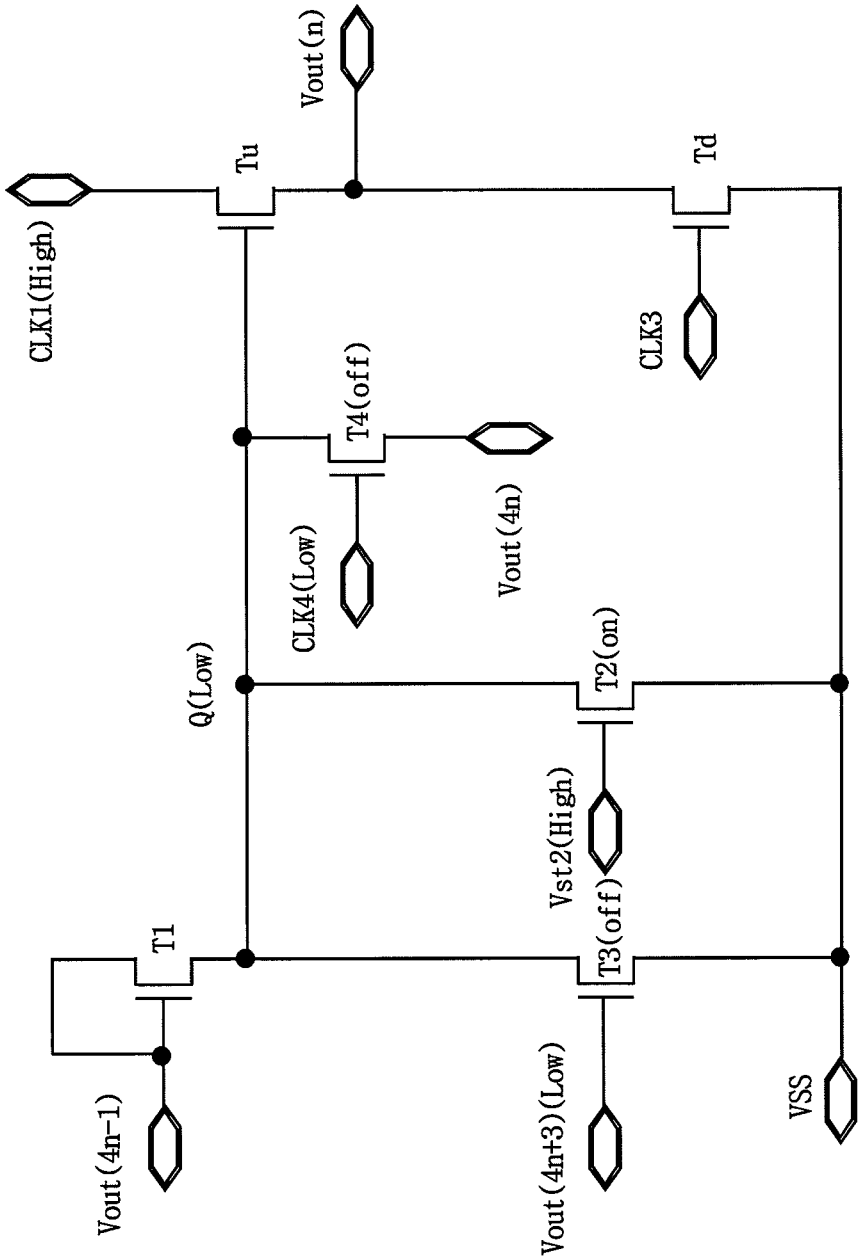
FIG. 7 illustrates a circuit diagram of the (4n+1)th stage in FIG. 6.

FIG. 7 illustrates a circuit diagram of the (4n+1)th stage in FIG. 6.

The circuit diagram illustrated in FIG. 7 has a configuration the same with the circuit diagram illustrated in FIG. 2 except an input to a gate terminal of the second TFT T2. In the meantime, since the stages except the (4n+1)th stages S4n+1 in the first embodiment are identical to the circuit diagram illustrated in FIG. 2, description of the identical stages will be omitted. And, the driving waveforms in FIG. 4 are applied to the first embodiment in the identical fashion with the comparative example shift register.

In the first embodiment, each of the second TFTS T2 in the (4n+1)th stages S4n+1 is turned on/off in response to the second start pulse Vst2, to connect a low voltage power source VSS supply line to the set node Q.

According to this, the shift register of the first embodiment may prevent the unstable fluctuation of the output of the (4n+1)th stages S4n+1 from occurring in the F period, under the following reason.

In the F period, the pull up TFT Tu in each of the (4n+1)th stages S4n+1 has the drain terminal with the first clock pulse CLK1 of the high state applied thereto. In this instance, since the second TFT T2 has the gate terminal with the second start pulse Vst2 applied thereto, the second TFT T2 is turned on. According to this, in the F period, the set node Q is initialized into the low state, and the pull up TFT Tu maintains a turn off state, positively.

That is, the shift register in accordance with the first preferred embodiment of the present invention turns on the second TFT T2 in each of the (4n+1)th stages S4n+1 by using the second start pulse Vst2 in the F period, to maintain the set node Q to be in the low state. Since the pull up TFT Tu is turned off positively if the set node Q is maintained in the low state, the leakage current is prevented, and the defective display caused by the fluctuation of the output voltage can be prevented.

Figure 8:
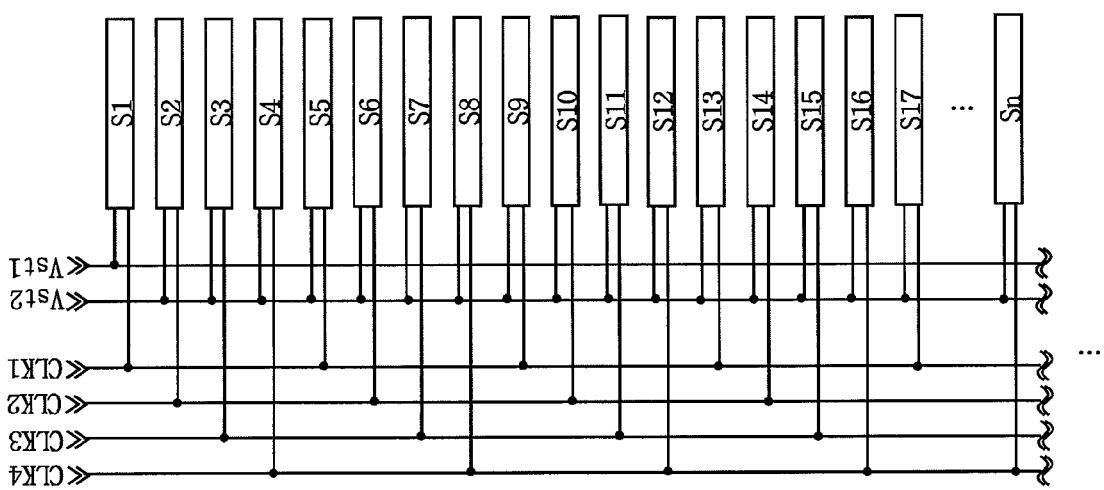
FIG. 8 illustrates a block diagram of a shift register in accordance with a second preferred embodiment of the present invention.

FIG. 8 illustrates a block diagram of a shift register in accordance with a second preferred embodiment of the present invention.

Different from the first embodiment, the (k)th stage Sk in the second embodiment is initialized as the second start pulse Vst2 is applied thereto at an initial stage of every frame. Of course, the first and second stages S1 and S2 use the first and second start pulses Vst1 and Vst2 applied thereto respectively for forwarding the scan pulse Vout of the high state, but do not use for initializing.

The circuit of each of the stages in the second embodiment is identical to the circuit illustrated in FIG. 7. According to this, alike the first embodiment, the shift register of the second embodiment can prevent the unstable fluctuation of the outputs of the (4n+1)th stages S4n+1 from occurring in the F period.

In the meantime, alike the second embodiment illustrated in FIG. 8, the (k)th stage of the third embodiment of the present invention is initialized as the second start pulse Vst2 is applied thereto at an initial stage of every frame. Of course, in the third embodiment, the first and second stages S1 and S2 use the first and second start pulses Vst1 and Vst2 applied thereto respectively for forwarding the scan pulse Vout of the high state, but do not use for initializing.

However, the third embodiment is different from the second embodiment in the circuit of the stage, as follows.

Figure 9:
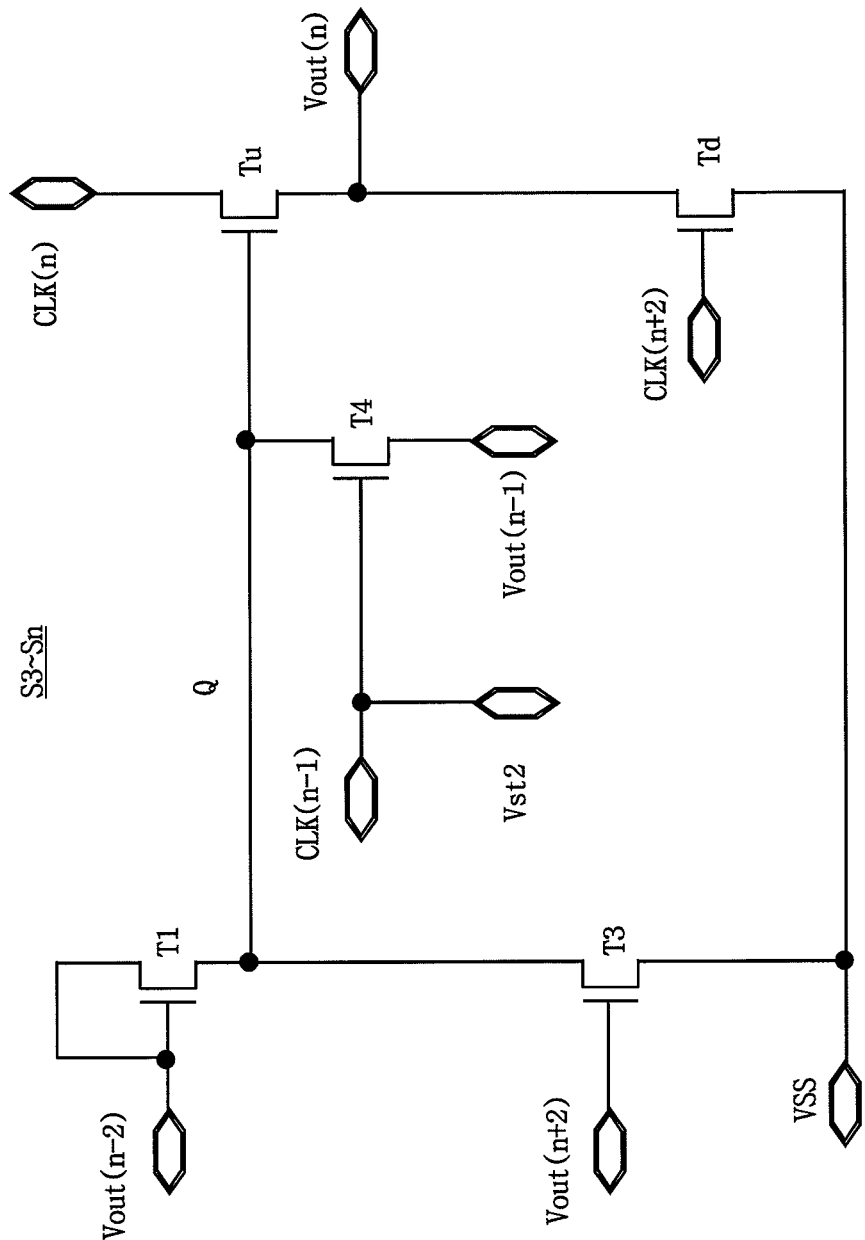
FIG. 9 illustrates a circuit diagram of a stage of a shift register in accordance with a third preferred embodiment of the present invention.

FIG. 9 illustrates a circuit diagram of a stage of a shift register in accordance with a third preferred embodiment of the present invention.

Referring to FIG. 9, the (k)th stage in the third embodiment includes a pull up TFT Tu, a pull down TFT Td, and first, third and fourth TFTS T1, T3 and T4. That is, the stage in the third embodiment has no second TFT T2 provided to the stages in the first and second embodiments.

Instead, the fourth TFT T4 in the third embodiment has a gate terminal with the second start pulse Vst2 and the clock pulse delayed by three horizontal periods than the clock pulse to the pull up TFT Tu supplied thereto. According to this, the fourth TFT T4 is turned on or turned off according to the second start pulse Vst2 or the clock pulse delayed by three horizontal period than the clock pulse supplied to the pull up TFT Tu. And, the fourth TFT T4 connects the output terminal of the (k−1)th stage Sk−1 to the set node Q when the fourth TFT T4 is turned on.

Thus, the third embodiment is one in which a function of the second TFT T2 of initializing the set node Q into the low state in the F period is to be made by the fourth TFT T4. Eventually, alike the first and second embodiments, the third embodiment can prevent the unstable fluctuation of the output of the (4n+1)th stages S4n+1 in the F period from occurring. Moreover, the third embodiment has effects of cost saving as well as space saving owing to removal of the second TFT T2.

The circuit diagram of a stage in accordance with the third preferred embodiment can be applied to the first embodiment.

As has been described, the shift register of the present invention has the following advantage.

The shift register of the present invention can prevent the unstable fluctuation of the outputs of the (4n+1)th stages S4n+1 from occurring in the period the first clock pulse CLK1 is forwarded for the first time right after the forwarding of the first start pulse Vst1 by applying the second start pulse Vst2 to the (4n+1)th stages S4n+1.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A shift register comprising:
a plurality of stages having any one of first and second start pulses, and any one of first to fourth clock pulses provided thereto to forward a scan pulse in succession,
wherein the first and second start pulses are in gate high voltage states for two horizontal periods, with the second start pulse forwarded with a delay of one horizontal period than the first start pulse,
the first to fourth clock pulses are in the gate high voltage states for two horizontal periods, with one horizontal period delay to one another, and
rest of the stages except the first and second stages are initialized in response to the second start pulse.

2. The shift register as claimed in claim 1, wherein each of the plurality of stages except the first and second stages includes:
a pull up switching device supplying any one of first to fourth clock pulses to an output terminal according to a signal state of a set node,
a pull down switching device supplying a low voltage power to the output terminal in response to a clock pulse delayed by two horizontal periods than the clock pulse provided to the pull up switching device,
a first switching device supplying a scan pulse from a two-previous stage to the set node in response to the scan pulse from the two-previous stage,
a second switching device supplying the low voltage power to the set node in response to the second start pulse,
a third switching device supplying the low voltage power to the set node in response to a scan pulse from a two-next stage, and
a fourth switching device supplying a scan pulse from a previous stage to the set node in response to a clock pulse delayed by three horizontal periods than the clock pulse provided to the pull up switching device.

3. The shift register as claimed in claim 1, wherein each of the plurality of stages except the first and second stages includes:
a pull up switching device supplying any one of the first to fourth clock pulses to an output terminal according to a signal state of a set node,
a pull down switching device supplying a low voltage power to the output terminal in response to a clock pulse delayed by two horizontal periods than the clock pulse provided to the pull up switching device,
a first switching device supplying a scan pulse from a two-previous stage to the set node in response to the scan pulse from the two-previous stage,
a third switching device supplying the low voltage power to the set node in response to a scan pulse from a two-next stage, and
a fourth switching device supplying a scan pulse from a previous stage to the set node in response to the second start pulse or a clock pulse delayed by three horizontal periods than the clock pulse provided to the pull up switching device.

4. The shift register as claimed in claim 1, wherein each of the first to fourth clock pulses has a blank period in which no clock pulse is forwarded between frames, the first to fourth clock pulses are forwarded at a falling edge of the first start pulse after the blank period, and the first to fourth clock pulses are forwarded in succession delayed to one another.

* * * * *